(12) United States Patent
Wang et al.

(10) Patent No.: US 8,317,356 B2
(45) Date of Patent: Nov. 27, 2012

(54) SOLAR POWERED LIGHT-EMITTING DEVICE

(75) Inventors: Ya-Tao Wang, Xiamen (CN); Tao Zhu, Xiamen (CN)

(73) Assignees: AU Optronics (Xiamen) Corp., Xiamen (CN); AU Optronics Corporation, Hsin-Chu (TW)

( * ) Notice: Subject to any disclaimer, the term of this patent is extended or adjusted under 35 U.S.C. 154(b) by 385 days.

(21) Appl. No.: 12/825,346

(22) Filed: Jun. 29, 2010

(65) Prior Publication Data
US 2011/0157876 A1   Jun. 30, 2011

(30) Foreign Application Priority Data
Dec. 25, 2009   (CN) .................... 2009 1 0259767

(51) Int. Cl.
 *F21L 4/00* (2006.01)
 *F21L 4/02* (2006.01)
(52) U.S. Cl. ......... 362/183; 362/157; 362/299; 362/300
(58) Field of Classification Search ................. 362/157, 362/183, 299, 300
See application file for complete search history.

(56) References Cited

U.S. PATENT DOCUMENTS
2009/0279288 A1* 11/2009 Chen ........................... 362/183
2010/0224248 A1*  9/2010 Kenney et al. ............... 136/259

FOREIGN PATENT DOCUMENTS
CN    2846991 Y    12/2006
CN    101226955 A   7/2008
CN    101241944 A   8/2008

\* cited by examiner

*Primary Examiner* — Joseph L Williams
*Assistant Examiner* — Nathaniel Lee
(74) *Attorney, Agent, or Firm* — CKC & Partners Co., Ltd.

(57) ABSTRACT

A solar powered light emitting device includes a solar cell battery, a plurality of organic light emitting diode (OLED) elements and a plurality of light guides. The OLED elements and the light guides are arranged on a light incident surface of the solar cell battery in which each of the light guides are arranged between every two neighboring OLED elements for guiding lights into the solar cell battery.

20 Claims, 6 Drawing Sheets

SOLAR POWERED LIGHT-EMITTING DEVICE

RELATED APPLICATIONS

This application claims priority to CHINA Application Serial Number 200910259767.5, filed Dec. 25, 2009, which is herein incorporated by reference.

BACKGROUND

1. Technical Field

The disclosure relates to a light emitting device, more particularly to a solar powered light emitting device.

2. Description of Related Art

Since the Organic Light Emitting Diode (OLED) possesses advantages of operating in low voltage, high brightness, light weight, compact size and wide viewing angle, the OLED, nowadays, is implemented to form an OLED display, especially for a portable device such as a mobile phone or a personal digital assistant (PDA).

Since an OLED display emits lights by itself and the brightness of the lights is quit enough, therefore, the OLED display is better than a conventional liquid crystal display (LCD).

When the OLED is applied on a portable device, the portable device needs to connect an external battery for providing power, especially a solar cell battery in an era highlighting green energy. However, when the portable device connects a solar cell battery, the portable device needs space for accommodating some connection elements between the solar cell battery and the OLED. Thus, issues of space and energy wasting will be raised.

In view of the mentioned prior arts, how to develop a solar powered light emitting device for improving the mentioned disadvantages shall be concerned.

SUMMARY

Therefore, an aspect of the disclosure is to present a solar powered light emitting device. By integrating at least an organic light emitting diode and a solar cell battery together, the disclosure omits the connection elements between the solar cell panel and the organic light emitting diode, so as to save material cost, reduce the thickness of the product, and lessen an inner space of the solar powered light emitting device.

Another aspect of the disclosure is to present a solar powered light emitting device. By configuring at least one light guide on the solar powered light emitting device, the light guide directs lights generated from the organic light emitting diode back into the solar cell battery for raising a utility rate.

The solar powered light emitting device in one of the embodiments comprises a solar cell battery, an organic light emitting diode and a light guide. The solar cell battery has a first surface served for facing and receiving lights and a second surface opposite to the first surface thereof. The solar cell pane comprises a substrate, a first electrode layer, and a second electrode layer. The substrate is disposed neighboringly on the second surface of the solar cell battery. The first electrode layer is disposed neighboringly on the first surface of the solar cell battery. The second electrode layer has an opposite polarity from the first electrode layer, is arranged between the substrate and the first electrode layer, and is electrically connected the first electrode layer. The organic light emitting diodes are sufficiently arranged on the first surface of the solar cell battery. Each of the organic light emitting diodes comprises a third electrode layer and an emitting layer. The third electrode layer has the same polarity as the second electrode layer does, and is electrically connected the first electrode layer. The emitting layer is disposed between the negative electrode layer and the second positive electrode layer. The light guides are respectively arranged between every two of the neighboring organic light emitting diodes for guiding lights into the solar cell battery.

In another one of the embodiments of the disclosure, the first electrode layer can be a negative electrode, and the second electrode layer and the third electrode layer are respectively a first positive electrode and a second positive electrode. The first positive electrode of the solar cell battery and the second positive electrodes of the organic light emitting diodes are electrically connected to the negative electrode of the solar cell battery. Thus, the solar cell battery and the organic light emitting diodes share the same negative electrode.

In the other one of the embodiments of the disclosure, the solar powered light emitting device further comprises a rechargeable battery, a switch and a controller. The rechargeable battery is electrically connected to the solar cell battery and each of the organic light emitting diodes. The switch is electrically connected to the solar cell battery and the rechargeable battery. The controller is electrically connected to the switch.

In the other one of the embodiments of the disclosure, each of the light guides comprises an optical main body and a plurality of optical microstructures. The optical main body is disposed on a surface of the first electrode layer, and is light transmissive. The optical microstructures are averagely arranged on a surface of the optical main body far away from the first electrode surface, and served for both guiding internal lights provided from the emitting layer and external lights to the solar cell battery.

DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The disclosure provides a solar powered light emitting device. The light emitting device at least includes a solar cell battery, an organic light emitting diode (OLED) and a light guide. The organic light emitting diode and the light guide are both arranged on a light incident surface of the solar cell battery. The light guide is arranged next to the organic light emitting diode and severed for not only guiding external lights (e.g. sunlight or indoor illuminating lights), but also guiding internal lights (e.g. lights generating from the organic light emitting diode) into the solar cell battery.

Thus, by integrating the organic light emitting diode and the solar cell battery together, the solar powered light emitting device effectively reduces inner space for accommodating the connection elements. Thus, the solar powered light emitting device eliminates energy loss which electric current passes through the connection elements. Meanwhile, the light guide returns the lights generating from the organic light emitting diode back to the solar cell battery so that redundant light can be reused again so as to prevent from wasting useless energy.

Figure 1:
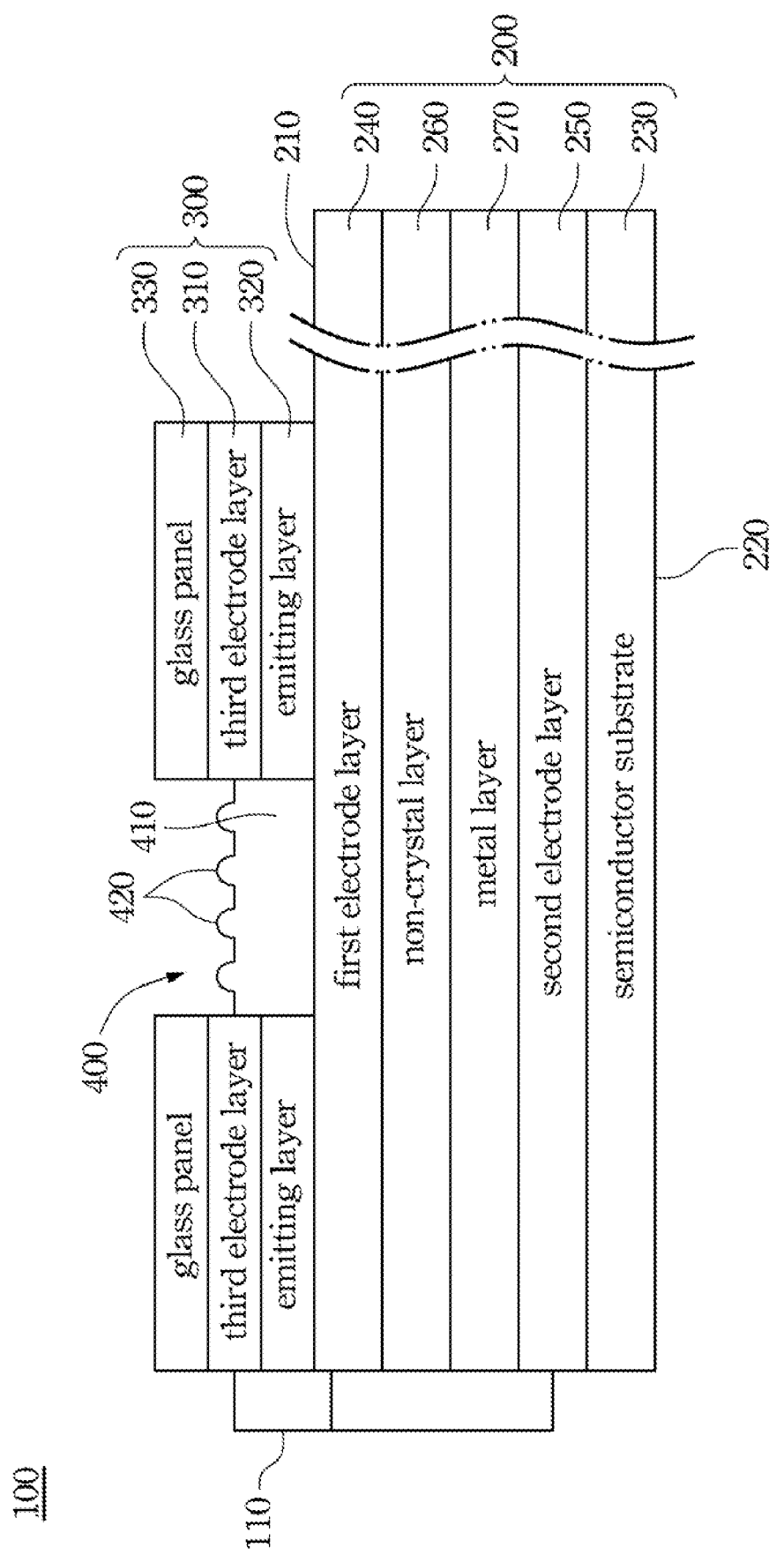
FIG. 1 illustrates a schematic diagram of a solar powered light emitting device according to one embodiment of the disclosure.
Figure 2:
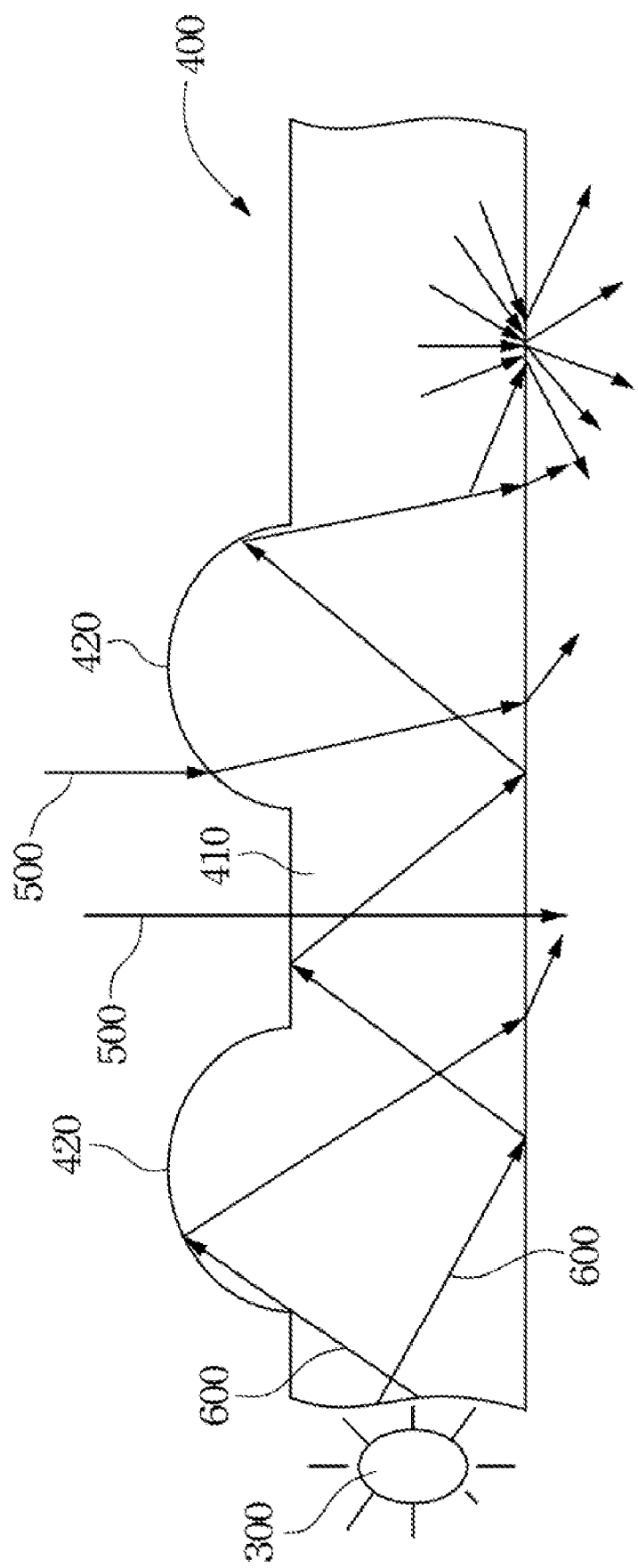
FIG. 2 illustrates a schematic diagram of ray movement of a light guide of the light emitting device according to the embodiment of the disclosure.

Refer to FIG. 1 and FIG. 2. FIG. 1 illustrates a schematic diagram of a solar powered light emitting device according to one embodiment of the disclosure. FIG. 2 illustrates a schematic diagram of ray movement of a light guide of the light emitting device according to the embodiment of the disclosure.

In the embodiment of the disclosure, the solar powered light emitting device 100 includes a solar cell battery 200, a plurality of organic light emitting diodes 300 and a plurality of light guides 400.

Specifically, the solar cell battery 200 has a first surface 210 and a second surface 220. The first surface 210 chosen for facing and receiving lights is called a "light incident surface", and the second surface 220 opposite to the first surface 210 is called a "back light surface".

The solar cell battery 200 is presented as a multilayered structure. According to a direction from the first surface 210 to second surface 220 thereof, the multilayer structure includes a first electrode layer 240, a non-crystal layer 260 (e.g. amorphous silicon), a metal layer 270 (e.g. aluminum, nickel, etc.), a second electrode layer 250 and a substrate 230, which are stacked sequentially together.

The substrate 230 is arranged neighboringly on the second surface 220 of the solar cell battery 200. The first electrode layer 240 is arranged neighboringly on the first surface 210 of the solar cell battery 200. The non-crystal layer 260 and the metal layer 270 are disposed between the first electrode layer 240 and the second electrode layer 250. The first electrode layer 240 and the second electrode layer 250 have opposite polarities to each other, and the second electrode layer 250 is arranged between the substrate 230 and the first electrode layer 240, and is neighboring to the second surface 220 of the solar cell battery 200.

The organic light emitting diodes 300 are spaced sufficiently and respectively arranged on the first surface 210 of the solar cell battery 200. Each of the organic light emitting diodes 300 is presented as a multilayered structure including a glass panel 330, a third electrode layer 310 and an emitting layer 320 (e.g. organic emitting layer 320), which are stacked sequentially together. The emitting layer 320 is arranged between the third electrode layer 310 and the first electrode layer 240.

To be noted, the multilayered structures of the organic light emitting diodes 300 and the solar cell battery 200 mentioned above only purpose for illustrating a consequence of those layers, other materials existed between any two of those layers is not limited in this disclosure.

For example, the first electrode layer 240 can be chosen as a negative electrode layer. The second electrode layer 250 can be chosen as a first positive electrode layer. The third electrode layer 310 can be chosen as a second positive electrode layer. Each of the second positive electrode layers and the first positive electrode layer are electrically connected with the negative electrode via a conductive path 110, respectively.

Therefore, because the organic light emitting diodes 300 and the solar cell battery 200 collectively share the same negative electrode layer, any connection element between the organic light emitting diodes 300 and the solar cell battery 200 can be omitted so that an inner space of the solar powered light emitting device 100 for accommodating the connection elements can be reduced.

The light guides 400 are disposed on the first surface 210 of the solar cell battery 200, and respectively arranged between every two of the neighboring organic light emitting diodes 300. Specifically, each of the light guides 400 further comprises an optical main body 410 and a plurality of optical microstructures 420. The optical main body 410 includes a highly refraction transparent material with good light transmission quality, and the optical main body 410 is disposed on a surface of the first electrode layer 240 (i.e. negative electrode layer). The optical microstructures 420 are arranged on a surface of the optical main body 410, and serve for guiding both the external lights 500 and the internal lights 600 mentioned above to the solar cell battery 200.

The "highly refraction transparent material" mentioned above can be defined as a high-density material that makes incident lights transmitted into the optical main body 410, and alleviates lights reflection while the incident lights are transmitted into the optical main body 410.

When the organic light emitting diodes 300 is operated to work, a working voltage is applied between the first electrode layer 240 (i.e. negative electrode layer) and the third electrode layer 310 (i.e. second positive electrode layer), thus, the emitting layer 320 is driven to irradiate lights outwardly.

When a part of the internal lights 600 from the organic light emitting diodes 300 is transmitted into the light guides 400, the part of the internal lights 600 can be guided to the solar cell battery 200 directly via the light guides 400; or the part of the internal lights 600 can be guided to the solar cell battery 200 after several reflections are happened via the light guides 400.

Therefore, except some internal lights generating from the emitting layer 320 are transmitted straightly towards the glass battery 330, the rest of the internal lights can be transmitted into the solar cell battery 200 for generating power.

Figure 3B:
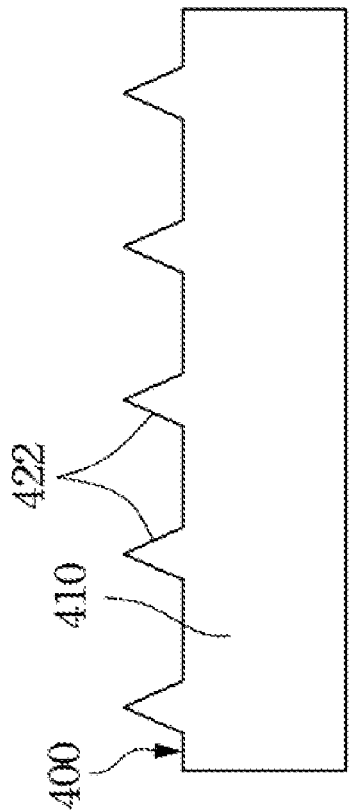
FIG. 3A~FIG. 3D illustrate structural diagrams of the light guide of the light emitting device according to varied embodiments of the disclosure.
Figure 3D:
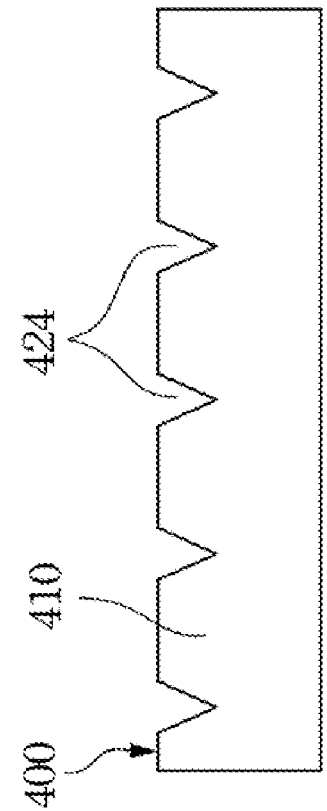
Figure 3A:
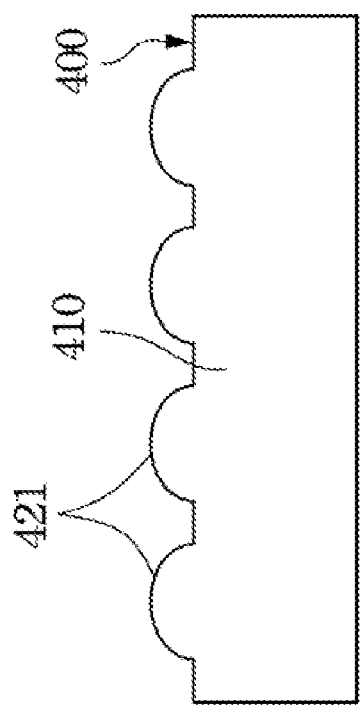
Figure 3C:
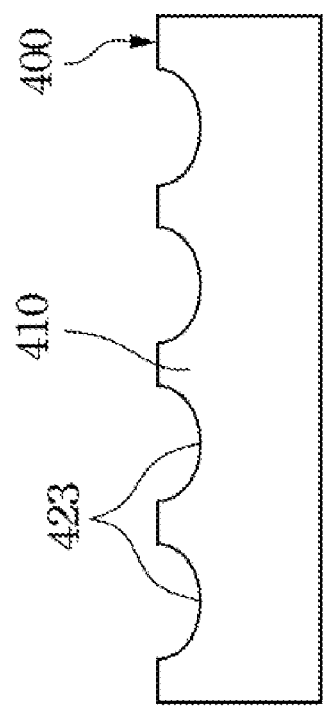

FIG. 3A~FIG. 3D illustrate structural diagrams of the light guide of the light emitting device according to varied embodiments of the disclosure. In one of the optional examples of the embodiment, each of the optical microstructures 420 can be practiced to form as a domed bulge 421 (FIG. 3A), a tri-pyramid bulge 422 (FIG. 3B), a domed depression 423 (FIG. 3C) or a tri-pyramid depression 424 (FIG. 3D). Also, refer to FIG. 1 and FIG. 2 again, the optical microstructures 420 are averagely arranged on a surface of the optical main body 410 far away from the first electrode surface 210, so as to evenly distribute both the internal lights 600 and the external lights 500 into the solar powered light emitting device 100, so as to improve a utilization rate of energy consumption.

To be noted, once one of the objects of the optical microstructures 420 is satisfied to evenly distribute the lights towards the solar powered light emitting device 100, the details of the optical microstructures 420 such as a distance between any two bulges (or depressions) or a height (or a depth) of any one bulge (or depression) thereof are not limited in the disclosure.

Figure 4:
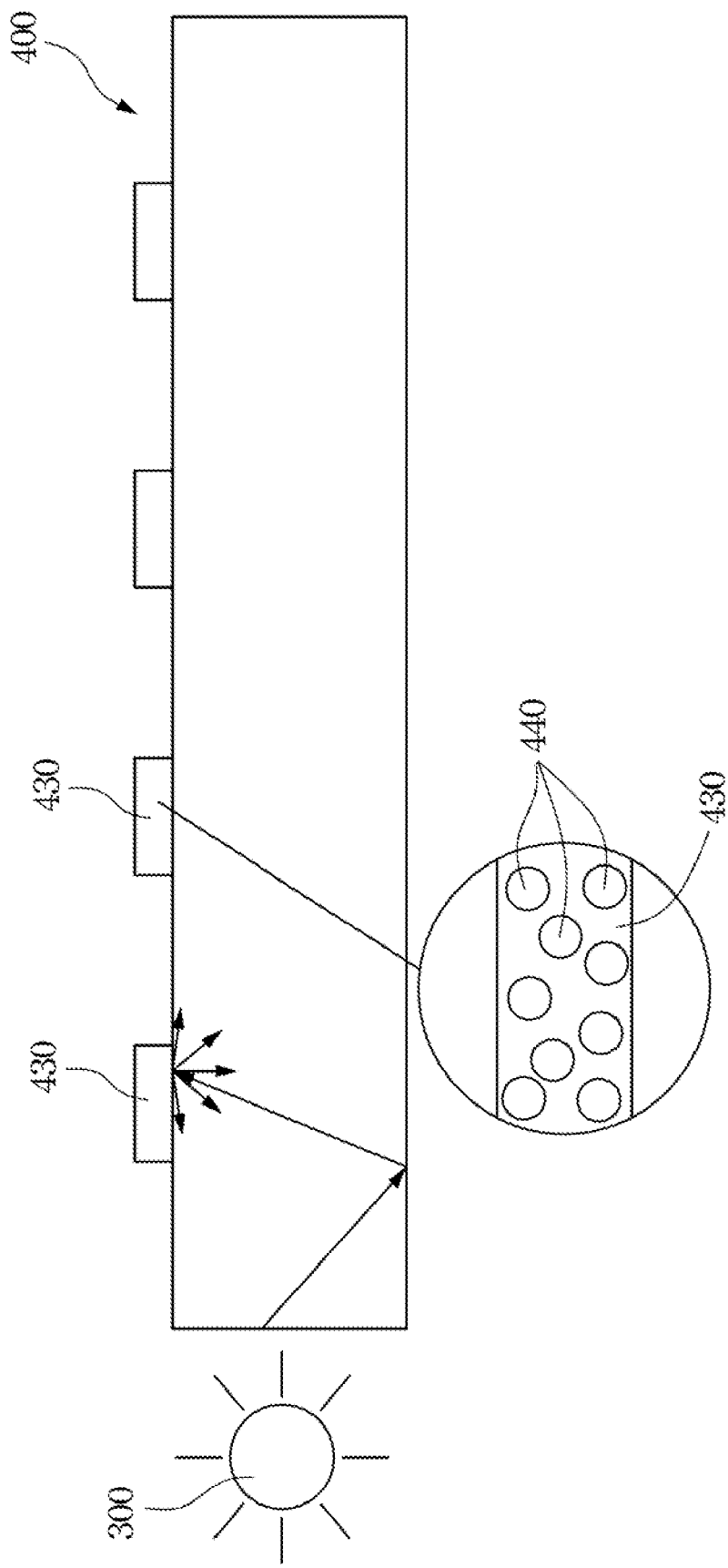
FIG. 4 illustrates a schematic diagram of a light guide of the solar powered light emitting device according to another embodiment of the disclosure.

FIG. 4 illustrates a schematic diagram of a light guide of the solar powered light emitting device according to another embodiment of the disclosure. In this embodiment, the optical microstructures 420 can be a plurality of printing dots 430 which are printed or coated on the optical main body 410 of the light guide 400. Thus, because the printing dots are capable of destroying total reflections of incident lights, the internal lights 600 and external lights 500 which are guided by the light guide 400 can be diffused by different angles. Thus, some of the internal lights 600 and external lights 500 can be transmitted towards the solar cell battery 200 evenly.

In another one of the optional examples of the embodiment, each of the optical microstructures 420 can be practiced to be an optical element (e.g. printing dots 430) having a plurality of diffusion particles 440 therein. Thus, because the diffusion particles 440 influence incident lights to perform in diffusion reflection, the reflected internal lights 600 and external lights 500 can be diffused towards different angles. Thus, some of the internal lights 600 and external lights 500 influenced by the diffusion particles 440 can be evenly transmitted towards the solar cell battery 200.

In the other one of the optional examples of the embodiment, the optical microstructures 420 can be practiced to form on the optical main body 410 in a manner of printing, machining, etching or electroplating.

Furthermore, the optical microstructures 420 and the optical main body 410 can be formed integrally by a monolithic forming method; or the optical microstructures 420 and the optical main body 410 can be formed independently to each other, before assembling.

Figure 5:
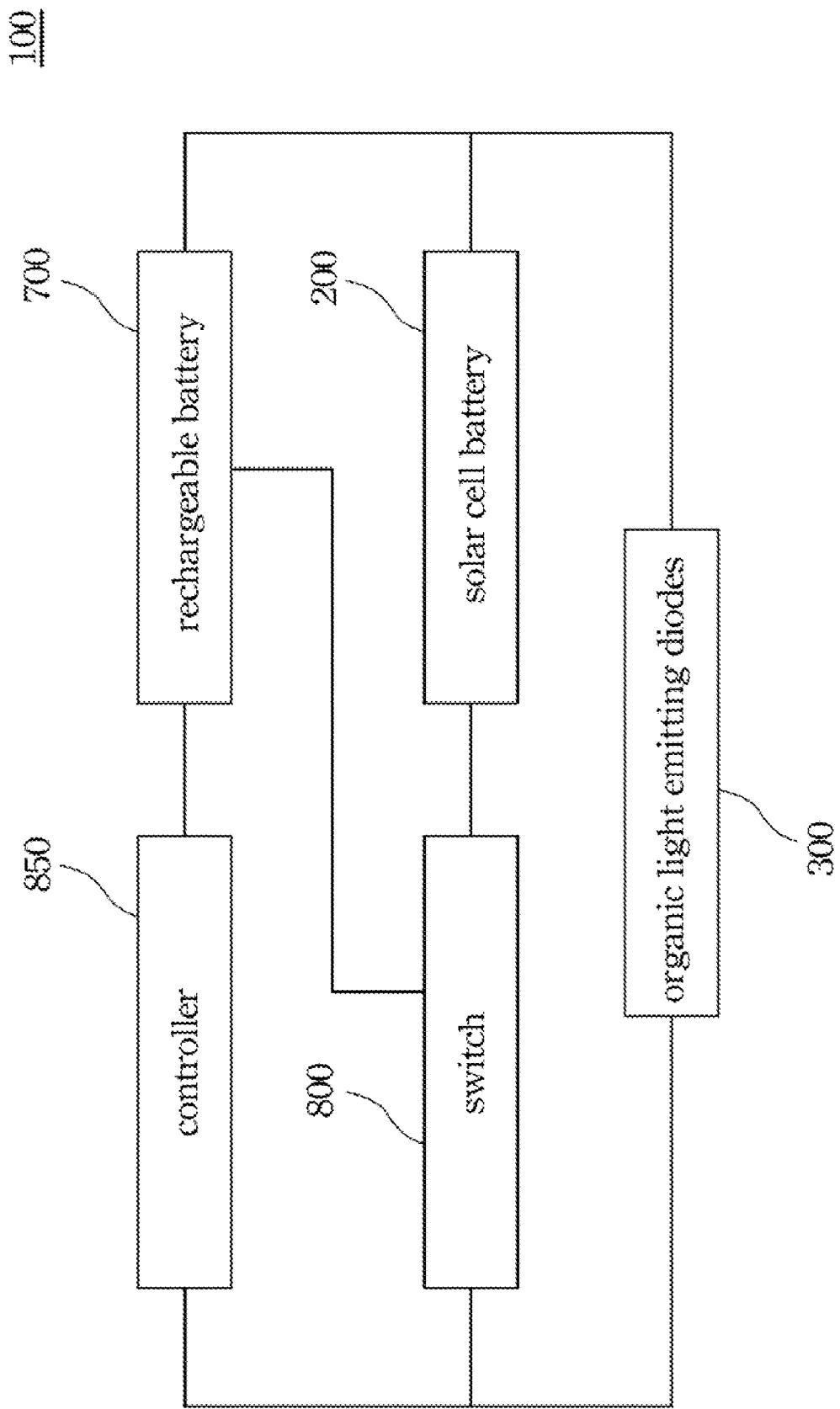
FIG. 5 illustrates a block diagram of a solar powered light emitting device according to the other embodiment of the disclosure.

Refer to FIG. 5. FIG. 5 illustrates a block diagram of a solar powered light emitting device according to the other embodiment of the disclosure. In this embodiment, the solar powered light emitting device 100 further includes a rechargeable battery 700, a switch 800 and a controller 850. The rechargeable battery 700 is electrically connected the solar cell battery 200 and the organic light emitting diode 300. The switch 800 is electrically connected the solar cell battery 200 and the rechargeable battery 700. The controller 850 is electrically connected the switch 800 and a human-machine interface (or a light sensor). Thus, the switch 800 can be controlled to turn on or off by an instruction sent from the human-machine interface (or a light sensor).

When the illumination of lights is enough, as in daytime, the controller 850 is instructed to turn off the switch 800, thus, the solar cell battery 200 generates and provides electric power to the organic light emitting diodes 300 on one hand, and generates and provides electric power to the rechargeable battery 700 on the other hand. On the contrary, when the illumination of lights is not enough, as in dawn, the controller 850 is instructed to turn on the switch 800, thus, the solar cell battery 200 stops working. Instead, the rechargeable battery 700 provides electric power to the organic light emitting diodes 300. Besides, when the rechargeable battery 700 is recharged completely, the controller 850 also is instructed to turn on the switch 800 for preventing from recharging excessively.

The solar powered light emitting device 100 can be practiced as one of daily used objects, such as ornaments (e.g. bracelet, necklace, hair clip, key ring or alike), stationary tools (e.g. pen product or ruler) or electronic devices (e.g. calculator or a frame of a display). When the object is carried and stays under an environment that the illumination of lights is enough, the solar cell battery 200 is operated to recharge electrically; on the other hand, when the organic light emitting diodes 300 is needed to irradiate, the organic light emitting diodes 300 is operated to perform irradiation, illumination, indication or other purposes with lights.

Figure 6:
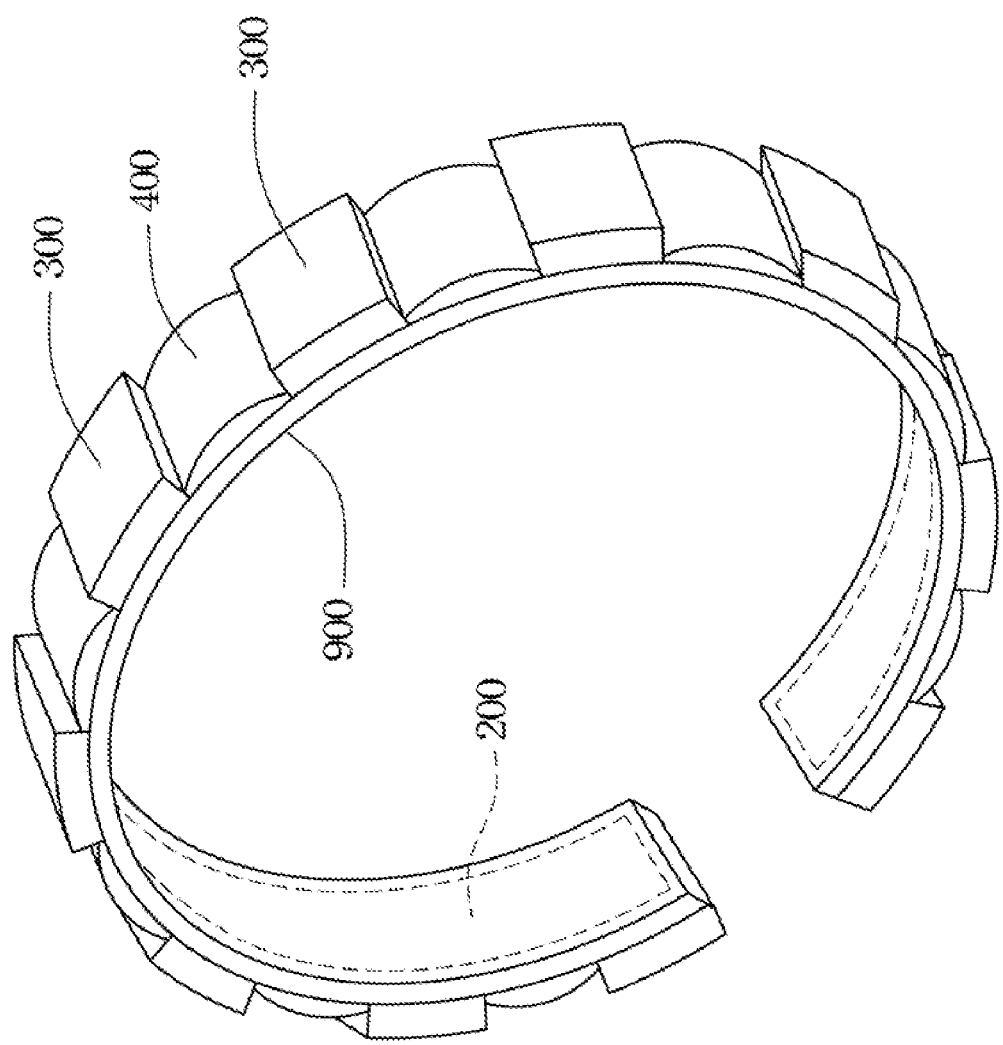
FIG. 6 illustrates a structural schematic diagram of a solar powered light emitting device according to the other embodiment of the disclosure.

FIG. 6 illustrates a structural schematic diagram of a solar powered light emitting device according to the other embodiment of the disclosure. For example, when the solar powered light emitting device 100 is applied to be a bracelet, the bracelet includes a ring like body 900. The organic light emitting diodes 300 and the light guides 400 are respectively arranged alternately on the outer surface of the ring like body 900. The solar cell battery 200 can be one part of the ring like body 900, or can be set inside the ring like body 900.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:
1. A solar powered light emitting device, comprising:
a solar cell battery having a first surface served for facing and receiving lights and a second surface opposite to the first surface thereof, and the solar cell pane comprising:
a negative electrode layer disposed neighboringly on the first surface of the solar cell battery; and
a first positive electrode layer disposed neighboringly on the second surface of the solar cell battery;
an organic light emitting diode comprising:
a second positive electrode layer electrically connected to the negative electrode layer; and
an emitting layer disposed between the negative electrode layer and the second positive electrode layer; and
a light guide disposed on the negative electrode layer, and arranged next to the emitting layer for guiding lights into the solar cell battery.

2. The solar powered light emitting device according to claim 1, wherein the light guide further comprises:
an optical main body disposed on a surface of the negative electrode layer, and being light transmissive;
a plurality of optical microstructures arranged on a surface of the optical main body, for guiding both internal lights provided from the emitting layer and external lights to the solar cell battery.

3. The solar powered light emitting device according to claim 2, wherein each of the optical microstructures is an optical element capable of destroying total reflections of the lights.

4. The solar powered light emitting device according to claim 2, wherein each of the optical microstructures is an optical element having a plurality of diffusion particles.

5. The solar powered light emitting device according to claim 2, wherein the optical microstructures are printing dots.

6. The solar powered light emitting device according to claim 5, wherein the optical microstructures and the optical main body are formed integrally or formed independently with each other.

7. The solar powered light emitting device according to claim 2, wherein each of the optical microstructures is a domed bulge or a tri-pyramid bulge.

8. The solar powered light emitting device according to claim 2, wherein each of the optical microstructures is a domed depression or a tri-pyramid depression.

9. The solar powered light emitting device according to claim 1, further comprising:
a rechargeable battery electrically connected to the solar cell battery and the organic light emitting diode;
a switch electrically connected to the solar cell battery and the rechargeable battery; and
a controller electrically connected the switch.

10. A solar powered light emitting devices, comprising:
a solar cell battery having a first surface served for facing and receiving lights and a second surface opposite to the first surface thereof, and the solar cell pane comprising:
a substrate disposed neighboringly on the second surface of the solar cell battery;
a first electrode layer disposed neighboringly on the first surface of the solar cell battery; and
a second electrode layer having an opposite polarity from the first electrode layer, arranged between the substrate and the first electrode layer, and electrically connected to the first electrode layer;
a plurality of organic light emitting diodes spaced sufficiently and respectively arranged on the first surface of the solar cell battery, and each of the organic light emitting diodes comprising:
a third electrode layer having the same polarity as the second electrode layer does, and electrically connected to the first electrode layer; and
an emitting layer disposed between the negative electrode layer and the second positive electrode layer; and
a plurality of light guides respectively arranged between every two of the neighboring organic light emitting diodes for guiding lights into the solar cell battery.

11. The solar powered light emitting device according to claim 10, wherein each of the light guides comprises:
an optical main body disposed on a surface of the first electrode layer, and being light transmissive;
a plurality of optical microstructures averagely arranged on a surface of the optical main body far away from the first electrode surface, for both guiding internal lights provided from the emitting layer and external lights to the solar cell battery.

12. The solar powered light emitting device according to claim 11, wherein each of the optical microstructures is an optical element capable of destroying total reflections of the lights.

13. The solar powered light emitting device according to claim 11, wherein the optical microstructures are printing dots.

14. The solar powered light emitting device according to claim 11, wherein each of the optical microstructures is an optical element having a plurality of diffusion particles.

15. The solar powered light emitting device according to claim 11, wherein each of the optical microstructures is a domed bulge or a tri-pyramid bulge.

16. The solar powered light emitting device according to claim 11, wherein each of the optical microstructures is a domed depression or a tri-pyramid depression.

17. The solar powered light emitting device according to claim 11, wherein the optical microstructures and the optical main body are formed integrally or formed independently with each other.

18. The solar powered light emitting device according to claim 10, wherein the first electrode layer is a negative electrode, and the second electrode layer and the third electrode layer are respectively positive electrodes.

19. The solar powered light emitting device according to claim 10, further comprising:
a rechargeable battery electrically connected to the solar cell battery and each of the organic light emitting diodes;
a switch electrically connected to the solar cell battery and the rechargeable battery; and
a controller electrically connected to the switch.

20. The solar powered light emitting device according to claim 10, wherein the solar powered light emitting device is an ornament.

* * * * *